United States Patent [19]

Tokunoh et al.

[11] Patent Number: 5,047,824
[45] Date of Patent: Sep. 10, 1991

[54] REVERSE CONDUCTING GATE TURN-OFF THYRISTOR

[75] Inventors: Futoshi Tokunoh; Katsumi Sato, both of Itami, Japan

[73] Assignee: Mitsubishi Denki Kabushiki Kaisha, Tokyo, Japan

[21] Appl. No.: 343,587

[22] Filed: Apr. 27, 1989

[30] Foreign Application Priority Data

Jan. 31, 1989 [JP] Japan .................................... 1-21673

[51] Int. Cl.$^5$ .................... H01L 29/74; H01L 29/747
[52] U.S. Cl. ......................................... 357/38; 357/39
[58] Field of Search ............... 357/38, 39, 39 A, 39 C, 357/39 E, 39 P, 39 L, 39 LA, 39 T

[56] References Cited

U.S. PATENT DOCUMENTS 4,791,470 12/1988 Shinohe et al. ....................... 357/39

FOREIGN PATENT DOCUMENTS

62-87457 6/1987 Japan .

Primary Examiner—Rolf Hille
Assistant Examiner—Wael Fahmy
Attorney, Agent, or Firm—Oblon, Spivak, McClelland, Maier & Neustadt

[57] ABSTRACT

A reverse conducting gate turn-off thyristor has a separating layer (26) in isolating zone (Z) for electrically separating into thyristor and diode portion (X, Z) a p type base layer (22) formed on an n type base layer (21). A gate electrode (29) is formed both on the p type base layer (22) and the separating layer. A portion of the gate electrode (29) on said separating layer serves as a gate collecting electrode (29a). Thus, area for the isolating zone (Z) and the gate collecting electrode (29a) become common, so that the efficiency of utilization of the wafer surface can be increased.

11 Claims, 8 Drawing Sheets

FIG. 1A (BACK GROUND ART)

FIG. 1B (BACK GROUND ART)

REVERSE CONDUCTING GATE TURN-OFF THYRISTOR

BACKGROUND OF THE INVENTION

1. Field of the Invention

The present invention relates to a reverse conducting gate turn-off thyristor and, more particularly, to a structure of an isolating zone between thyristor and diode portions of the reverse conducting gate turn-off thyristor.

2. Description of the Background Art

A reverse conducting gate turn-off thyristor is an integrated device which includes on a wafer a gate turn-off thyristor and a free wheel diode connected antiparallel to the gate turn-off thyristor. Usually, on a wafer, a resistance isolates a thyristor portion serving as a gate turn-off thyristor from a diode portion serving as a feedback diode. This device miniaturized a device such as an inverter incorporating a gate turn-off thyristor.

Figure 1A:
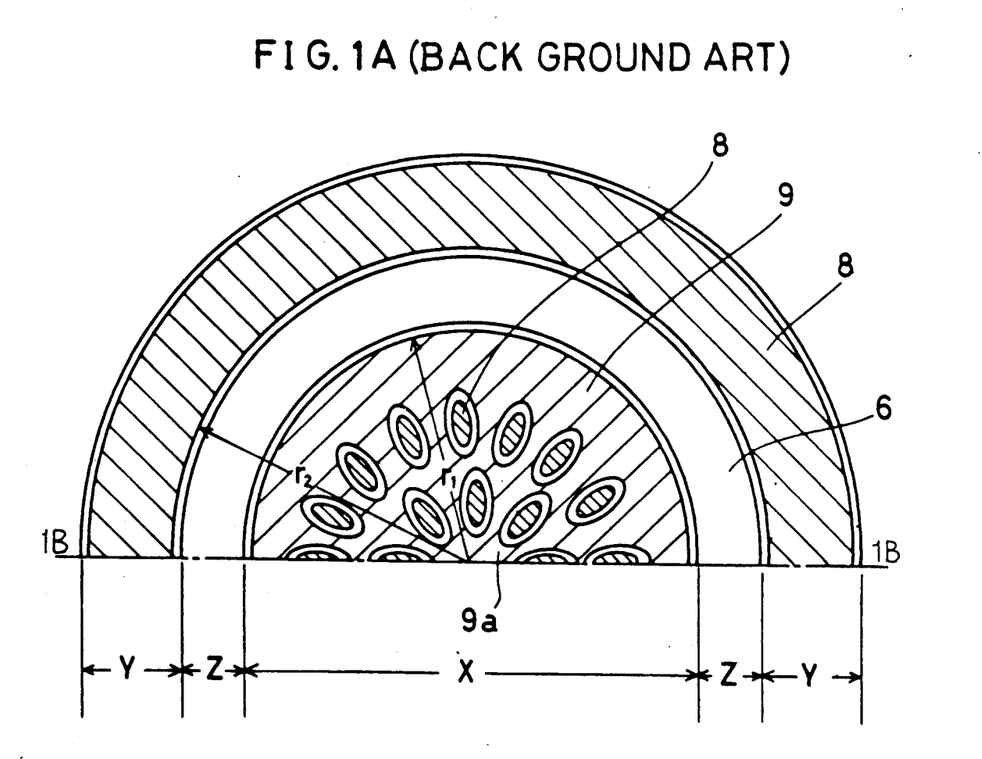
FIG. 1A is a top plan view showing a half of the surface structure of a conventional reverse conducting gate turn-off thyristor of compression bonded type.
Figure 1B:
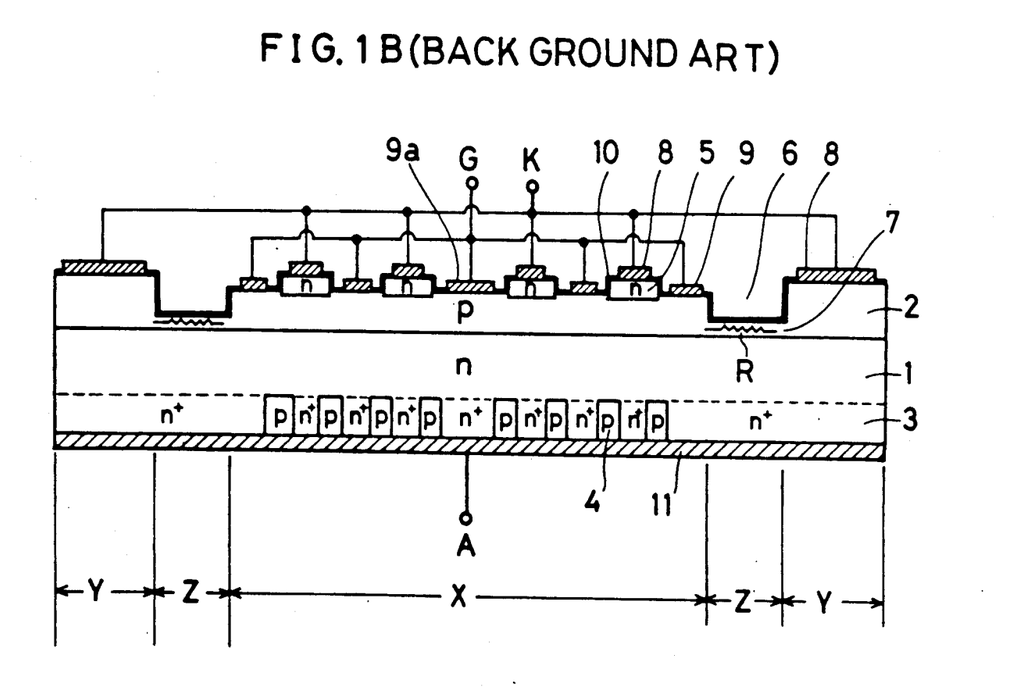
FIG. 1B is a sectional side view showing the structure taken along the line I—I of FIG. 1A.

FIG. 1A is a top plan view showing a half of the top surface of a conventional reverse conducting gate turn-off thyristor of compression bonded type. FIG. 1B is a sectional side view showing the structure taken along the line I—I in FIG. 1A. Reference symbols X, Y and Z indicate a thyristor portion, a diode portion and an isolating zone, respectively.

Referring to FIG. 1B, a p type base layer 2 and an n+ type layer 3 are formed on the upper and lower surfaces of an n type base layer 1, respectively. In a thyristor portion X, a plurality of p type emitter regions 4 are selectively formed within the n+ type layer 3, and a plurality of n type emitter regions 5 are selectively formed upon the p type base layer 2. In an isolating zone Z, a trench 6 is provided in the p type base layer 2 by means of selective etching or the like. A remaining part under the trench 6 of the p type base layer 2 of a low concentration serves as an isolation resistance region 7. As can be seen from FIG. 1A, the trench 6, and therefore the isolation resistance region 7 surround the thyristor portion X to isolate the thyristor portion X form a diode portion Y.

Cathode electrodes 8 are provided on the n type emitter region 5 and the p type base layer 2 in the diode portion Y. A gate electrode 9 is provided on the p type base layer 2 in the thyristor portion X. A portion of the gate electrode 9 in the center serves as a gate collecting electrode, which is denoted by a reference numeral 9a. Cathode and gate electrodes 8 and 9 are insulated by an insulation film 10. An anode electrode 11 is provided on the back surface of the n+ type layer 3 and p type emitter regions 4. The anode electrode 11 short-circuits the n+ type layer 3 and the p type emitter regions 4 to form a shorted emitter structure, whereby turning-off capability can be increased.

Figure 2:
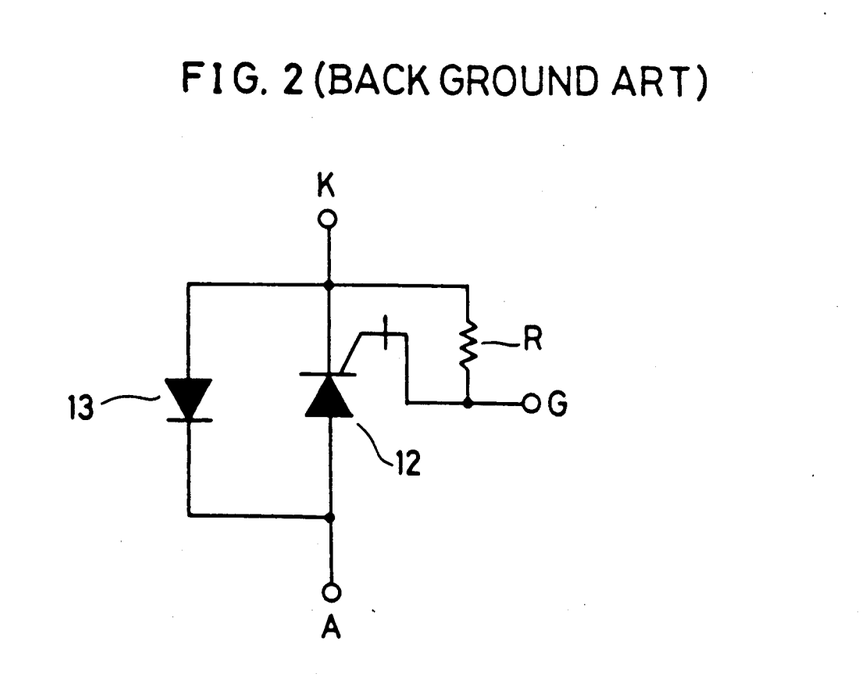
FIG. 2 is a circuit diagram showing an equivalent circuit of a reverse conducting gate turn-off thyristor.

FIG. 2 is a circuit diagram illustrating an equivalent circuit in the above reverse conducting gate turn-off thyristor. A gate turn-off thyristor 12 consists of the p type emitter regions 4, n type base layer 1, p type base layer 2 and n type emitter regions 5 in the thyristor portion X of FIG. 1B. A free wheel diode 13, which is in antiparallel connection with the gate turn-off thyristor 12, consists of the n type base layer 1 and p type base layer 2 in the diode portion Y of FIG. 1B. An isolation resistance R is formed by a sheet resistivity in the isolation resistance region 7 of FIG. 1B. The isolation resistance R is provided between the gate and cathode of the gate turn-off thyristor 12 in the equivalent circuit.

The above reverse conducting gate turn-off thyristor does not have a shorted emitter structure with respect to the n type emitter region 5. Accordingly, when this conventional reverse conducting gate turn-off thyristor is turned off, the PN junction defined by the n type emitter region 5 and the p type base layer 2 must remains reverse-biased in order to inhibit electrons from flowing from the n type emitter region 5 into the p type base layer 2. Hence, to turn off the thyristor, the cathode and gate electrodes 8 and 9 are reverse-biased. At this time, reactive current flows through the isolation resistance R, which increase a burden on a gate driving circuit not shown. Therefore, it is desirable that the isolation resistance R has a value as large as possible.

A value of the isolation resistance R is uniquely determined by the resistivity of the isolation resistance region 7 and the width of the isolating zone Z. The value of the isolation resistance R of the annular isolating zone Z shown in FIG. 1A is given by the following equation;

$$R = \rho_{PB} \times \ln(r_2/r_1)$$

where $\rho_{PB}$ is a resistivity of the isolation resistance region 7, i.e., the p type base layer 2, $r_1$ is an inner diameter of the isolating zone Z, and $r_2$ is an outer diameter thereof. The resistivity $\rho_{PB}$ of the p type base layer 2 is restricted in increase in view of a forward blocking voltage of the device. Specifically, assuming that the impurity profile of the p type base layer 2 is constant, voltage applied between the anode and cathode permits a depletion layer to extend uniformly into the p type base layer 2 from the PN junction defined by the n type base layer 1 and the p type base layer 2, while the thyristor is turned off. If the depletion layer reaches up to the surface of the isolation resistance region 7, it is feared that the breakdown of the device is caused. To prevent this, it is necessary to make the resistivity $\rho_{PB}$ of the p type base layer 2 small enough. On the other hand, shortening the inner diameter $r_1$ of the isolating zone Z is restricted in view of current capacity. In other words, the thyristor portion X must have a sufficient area to make a desired current capacity available, so that the inner diameter $r_1$ of the isolating zone Z can not be made smaller than the value corresponding to this sufficient area of the thyristor portion X.

Thus, in order to increase the isolation resistance R, it is necessary to make the outer diameter $r_2$ of the isolating zone Z larger, that is, to broaden its width $(r_2 - r_1)$. Since the isolating zone Z functions inactively in the operation of the reverse conducting gate turn-off thyristor, broadening the width $(r_2 - r_1)$ of the isolating zone Z to increase its area causes the efficiency of utilization of a wafer surface in the reverse conducting gate turn-off thyristor to decrease.

Further, in order to make the reverse conducting gate turn-off thyristor shown in FIGS. 1A and 1B have a large capacity, current capacity in the thyristor portion X and diode portion Y must be increased. To increase current capacity in the thyristor portion X, the inner diameter $r_1$ of the isolating zone Z must be increased. Thus, if the value of the isolation resistance R and therefore $(r_2/r_1)$ are kept constant, the width of the isolating zone $(r_2 - r_1)$ must further be increased. As a result, with the reverse conducting gate turn-off thyristor having a greater capacity, the efficiency of utilization of the wafer surface will be further reduced.

The reverse conducting gate turn-off thyristor shown in FIGS. 1A and 1B has to drain charges accumulated in the p type base layer 2 out through the gate electrode 9 by reverse-biasing between the cathode and gate to block the anode current. Reverse gate current flowing in the gate at this time is determined with the value of the anode current and the turn-off gain of the thyristor. The turn-off gain is usually 3 to 5, and accordingly, $\frac{1}{3}$ to 1/5 of the main current has to be drained outside through the gate 9. Thus, gate turn off thyristors need a gate conducting capability much greater than ordinal thyristors. The reverse conducting gate turn-off thyristor shown in FIGS. 1A and 1B is provided with a gate collecting electrode 9a which is in contact with a gate external electrode not shown, for flowing such large current. The area of the gate collecting electrode 9a has to be increased to increase the current capacity of the device, so that the efficiency of utilization of the wafer surface is reduced due to the area required for the gate collecting electrode 9a.

As hereinbefore described, the conventional reverse conducting gate turn-off thyristor has a disadvantage that the efficiency of utilization of the wafer surface is decreased when the resistance value of the isolation resistance R isolating the thyristor portion X from the diode portion Y is increased, or when the current capacity of the device is increased.

SUMMARY OF THE INVENTION

A reverse conducting gate turn-off thyristor according to the present invention comprises a first conductivity type first semiconductor layer having first and second major surfaces, a second conductivity type second semiconductor layer formed on the first major surface of the first semiconductor layer, a separating layer formed in the second semiconductor layer for electrically separating the second semiconductor layer into first and second regions, a second conductivity type third semiconductor layer formed on a portion of the second major surface of the first semiconductor layer corresponding to the first region of the second semiconductor layer, a first conductivity type fourth semiconductor layer formed on the first region of the second semiconductor layer, a first electrode formed both on the third semiconductor layer and a portion of the second major surface of the first semiconductor layer corresponding to the second region of the second semiconductor layer, a second electrode formed both on the formed semiconductor layer and the second region of the second semiconductor layer, and a third electrode formed both on the first region of the second semiconductor layer and the separating layer.

According to the present invention, a third electrode is provided on a separating layer, which is connected to a first region in a second semiconductor layer. Therefore, if the third electrode on the isolating layer is used as a collecting electrode, areas of the separating layer and the collecting electrode, which are the cause of decrease of the utilization efficiency of the wafer surface, become common, so that the utilization efficiency of the wafer surface can be increased. Consequently, a reverse conducting gate turn-off thyristor can be implemented in which high efficiency of utilization of the wafer surface can be maintained even when insulation resistance or current capacity is increased.

Accordingly, it is an object of the present invention to provide a reverse conducting gate turn-off thyristor in which high efficiency of utilization of the wafer surface can be maintained even when insulation resistance or current capacity is increased.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 3A:
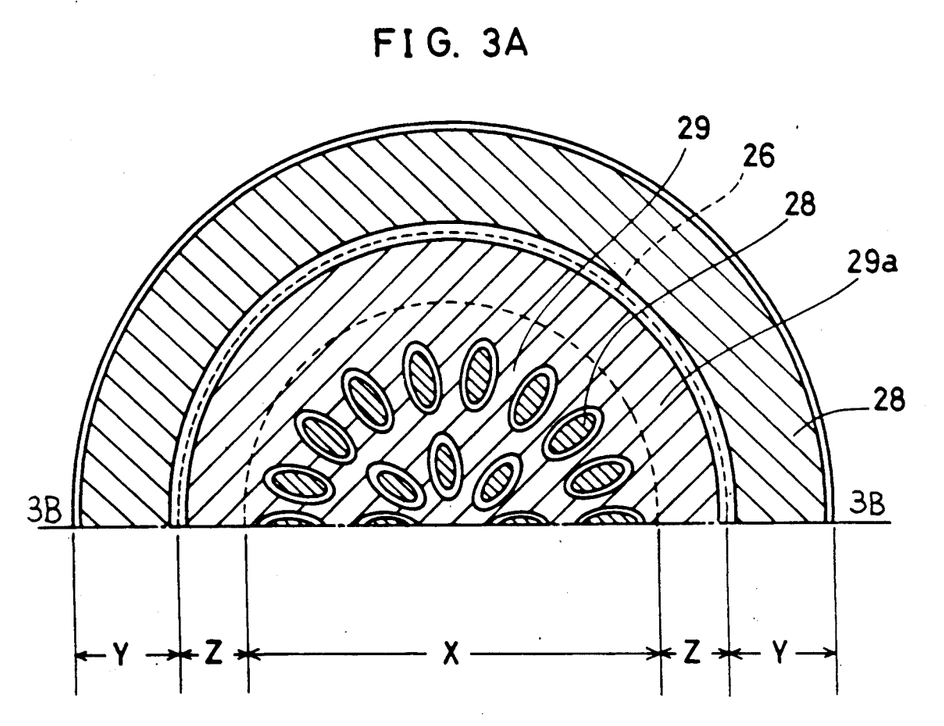
FIG. 3A is a top plan view showing a half of the surface structure of an embodiment of a reverse conducting gate turn-off thyristor according to the present invention.
Figure 3B:
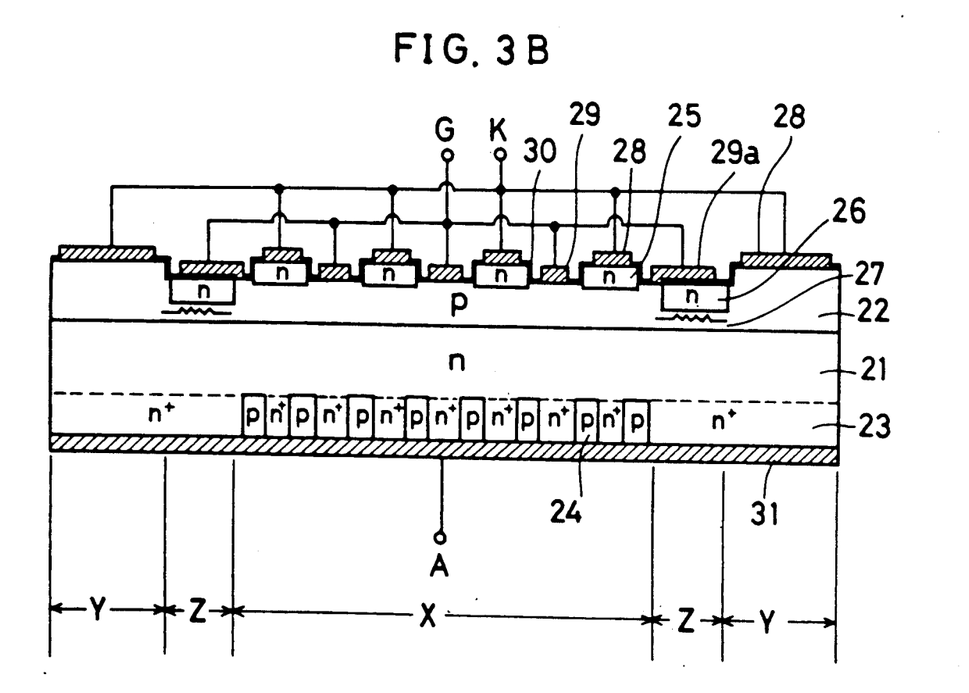
FIG. 3B is a sectional side view showing the structure taken along the line III—III of FIG. 3A.

FIG. 3A is a top plan view showing a half of the surface structure of an embodiment of a reverse conducting gate turn-off thyristor according to the present invention. FIG. 3B is a sectional side view showing the structure taken along the line III—III in FIG. 3A. Reference symbols X, Y and Z designates a thyristor portion, a diode portion and an isolating zone, respectively.

Referring to FIG. 3B, a p type base layer 22 and an n+ type layer 23 are formed on first and second major surfaces of an n type base layer 21, respectively. In a thyristor portion X, a plurality of p type emitter regions 24 are selectively formed within the n+ type layer 23, and a plurality of n type emitter regions 25 are selectively formed upon the p type base layer 22. In an isolating zone Z, an n type separating layer 26 for electrically separating the p type base layer 22 into two parts is provided in the p type base layer 22 to a prescribed depth. A part of the p type base layer 22 of a low impurity concentration, under the n type separating layer 26, serves as an isolation resistance region 27. As can be seen from FIG. 3A, the n type separating layer 26 and therefore the isolation resistance region 27 surround the thyristor portion X to completely isolate the thyristor portion X from a diode portion Y.

Cathode electrodes 28 are provided on the n type emitter regions 25 and the p type base layer 22 in the diode portion Y, and a gate electrode 29 is provided on the p type base layer 22 in the thyristor portion X. These electrodes 28 and 29 are insulated by an insulation film 30. The insulation film 30 covers the whole upper surface of the n type separating layer 26. A gate collecting electrode 29a is formed on the n type separating layer 26 while insulated from the separating layer 26 by the insulation film 30. As can be seen from FIG. 3A, the gate collecting electrode 29a is formed to be integrated with the gate electrode 29.

An anode electrode 31 is provided on the rear surface of the n+ type layer 23 and p type emitter regions 24. The anode electrode 31 short-circuits the n+ type layer 23 and the p type emitter regions 24 to form a shorted emitter structure, so that the turn-off capability of the device is increased. The present invention is also applicable when the p type emitter region 24 does not have a shorted emitter structure, that is, the thyristor portion X has the p type emitter region 24 formed on the whole second major surface of the n type base layer 21. The aforementioned reverse conducting gate turn-off thyristor has the same equivalent circuit as in FIG. 2.

A method of manufacturing the reverse conducting gate turn-off thyristor of compression bonded type shown in FIG. 3A and FIG. 3B will now be described. After preparing an n type semiconductor wafer for serving as an n type base layer 21, a p type base layer 22 is formed on a first major surface of the n type semiconductor wafer by diffusion of p type impurities or epitaxial growth. Further, an n+ type layer 23 is formed on a second major surface of the n type semiconductor wafer by diffusion of n type impurities. Then, p type emitter regions 24 are formed within the n+ type layer 23 by selective diffusion of p type impurities.

Then, in the diode portion X, an n type layer is formed on the p type base layer 22 by diffusing n type impurities into the p type base layer 22. Thereafter, the n type layer is selectively removed to leave n type emitter regions 25. In concurrence with the removal of the n type layer, an upper surface portion of the p type base layer 22 in the isolating zone Z is also removed. Then, in the isolating zone Z, an n type separating layer 26 of a prescribed thickness is formed by diffusing n type impurities. A portion, remaining under the n type separating layer 26, of the p type base layer 22 serves as an isolation resistance region 27. According to the present embodiment, the isolation resistance region 27 can be precisely controlled in its thickness by a diffusion process having higher accuracy than etching. As a result, resistivity of the isolation resistance region 27 can be controlled with high accuracy.

Then, an insulation film 30 is formed over the whole surface of the p type base layer 22. After patterning the insulation film 30, metalization takes place to form a cathode electrodes 28, a gate electrode 29 and a gate collecting electrode 29a. Further, an anode electrode 31 is formed on the back surface of the wafer by metalization. Thus the compression bonded type reverse conducting gate turn-off thyristor shown in FIG. 3A and FIG. 3B can be implemented.

In the conventional reverse conducting gate turn-off thyristor shown in FIG. 1A and FIG. 1B, the efficiency of utilization of the wafer surface is reduced both by the gate collecting electrode 9a and isolating zone Z. In accordance with the above embodiment, however, the gate collecting electrode 29a is provided within the area of the isolating zone Z, so that the wafer surface can be used more effectively, i.e., an ineffective area in the wafer surface can be decreased. Consequently, the efficiency of utilization of the wafer surface can be increased.

Figure 3C:
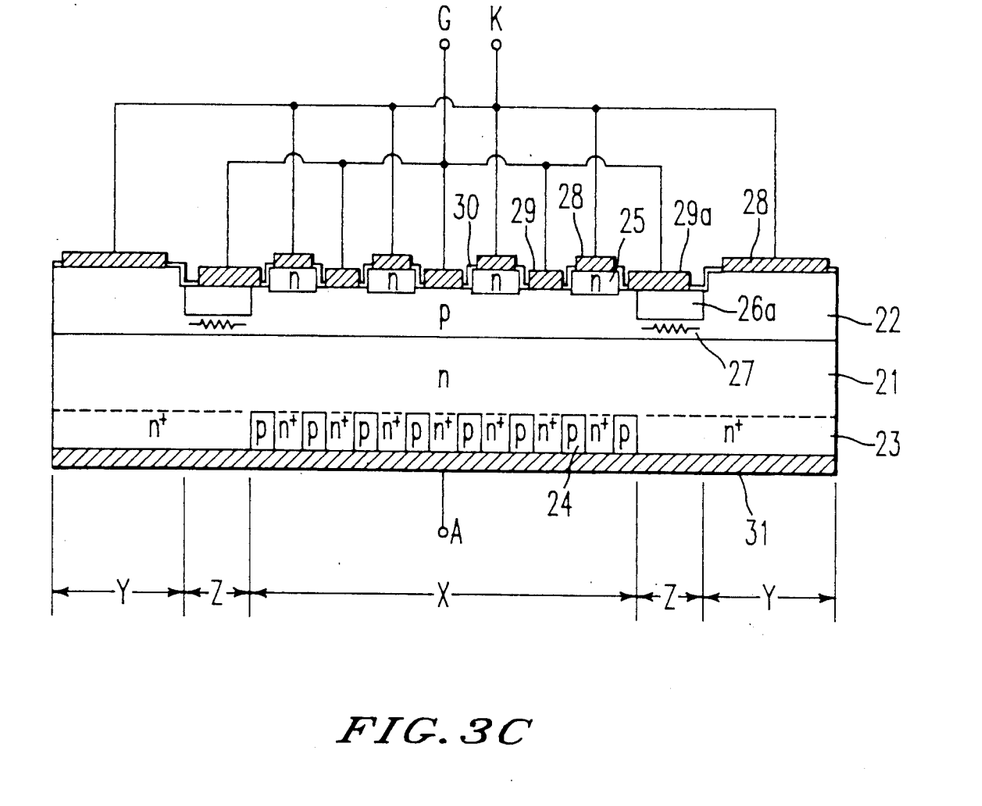
FIG. 3C is a sectional side view of a further embodiment of the present invention including an isolating layer of insulating material.

Meanwhile, instead of the isolating layer 26 of an n type semiconductor, an isolating layer 26a composed of insulation material such as SiO$_2$ or high resistance material can be used as shown in FIG. 3C. In this case, the insulation film 30 may not be formed over the isolating layer 26a.

Figure 4A:
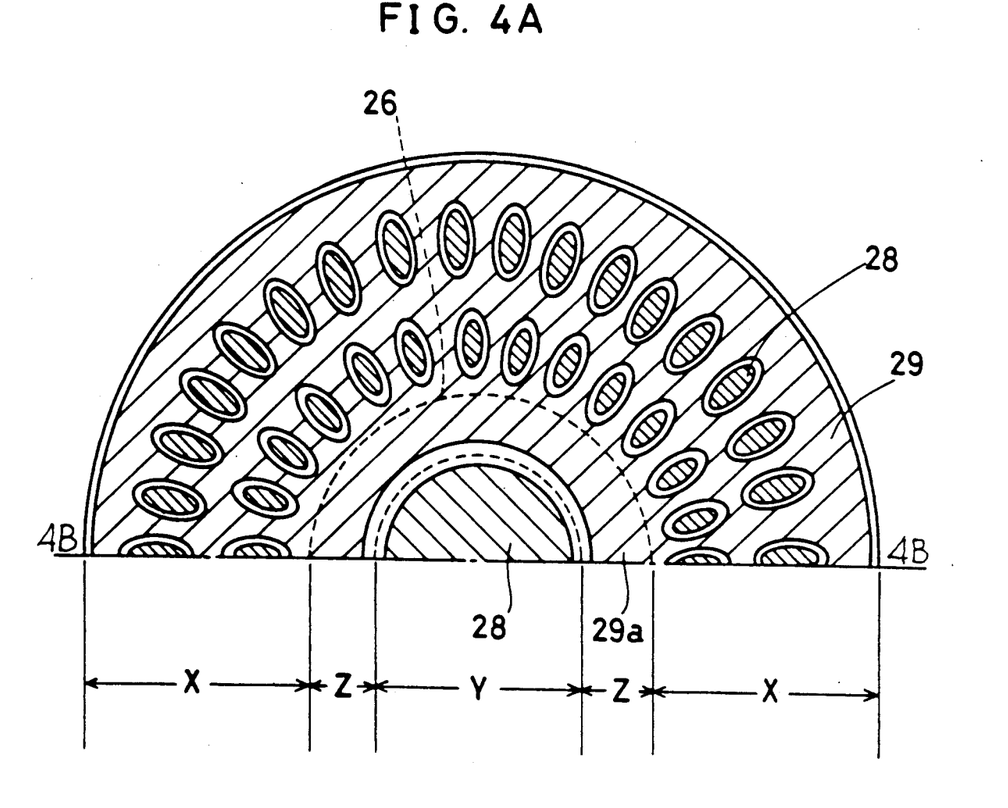
FIG. 4A is a top plan view showing a half of the surface structure of another embodiment of the reverse conducting gate turn-off thyristor according to the present invention.
Figure 4B:
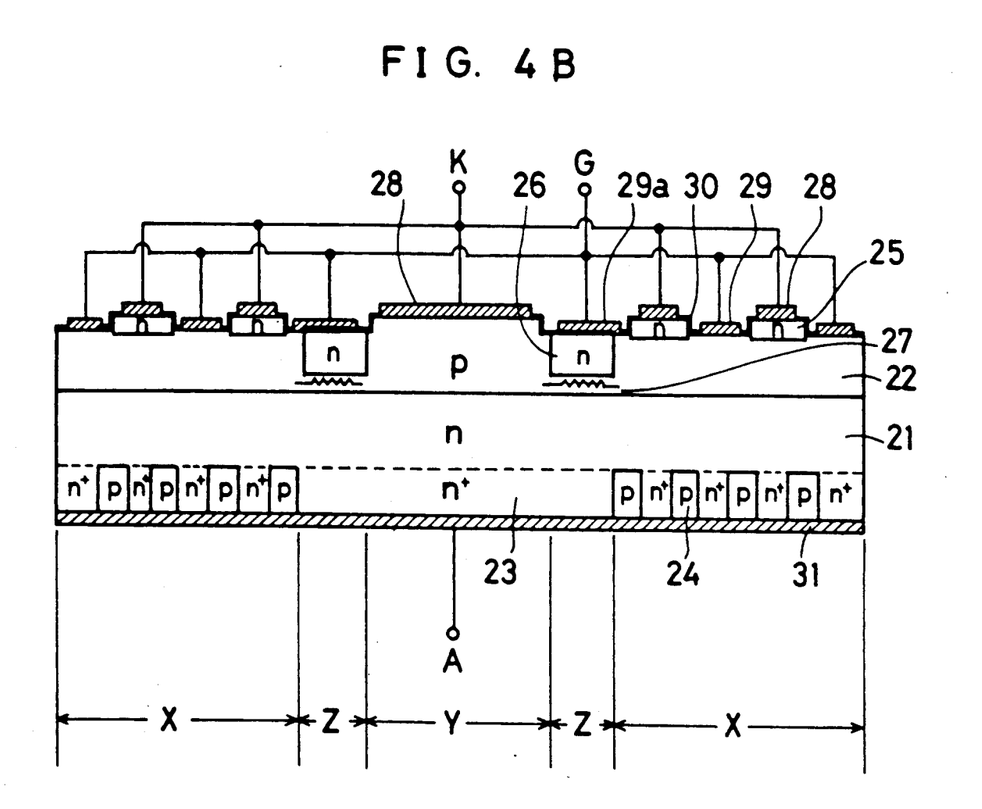
FIG. 4B is a sectional view showing the structure taken along the line IV—IV of FIG. 4A.

FIG. 4A is a top plan view showing a half of the top surface of another embodiment of the reverse conducting gate turn-off thyristor according to the present invention. FIG. 4B is a sectional side view showing the structure taken along the line IV—IV of FIG. 4A. While the embodiment described above with reference to FIGS. 3A and 3B has its gate turn-off thyristor disposed inside the isolating zone Z and its feedback diode outside it, this embodiment shown in FIGS. 4A and 4B has its gate turn-off thyristor disposed outside an isolating zone Z and its feedback diode inside it. A gate collecting electrode 29a is formed within the isolating zone Z similarly to the former embodiment. Consequently, in accordance with this embodiment shown in FIGS. 4A and 4B, the efficiency of utilization of a wafer surface can also be increased by virtue of effective use of the wafer surface.

Although the present invention has been described and illustrated in detail, it is clearly understood that the same is by way of illustration and example only and is not to be taken by way of limitation, the spirit and scope of the present invention being limited only the terms of the appended claims.

What is claimed is:

1. A reverse conducting gate turn-off thyristor, comprising:
   a first conductivity type first semiconductor layer having a first conductivity and first and second major surfaces;
   a second conductivity type second semiconductor layer formed on said first major surface of said first semiconductor layer and having a second conductivity different from said first conductivity;
   a separating layer formed in said second semiconductor layer from a surface thereof to a predetermined depth of said second semiconductor layer for electrically separating said second semiconductor layer into first and second regions, said separating layer being positioned between said first and second regions and comprising one of an insulation material and a high resistance material;
   a second conductivity type third semiconductor layer formed on a portion of said second major surface of said first semiconductor layer adjacent to said first region of said second semiconductor layer;
   a first conductivity type fourth semiconductor layer formed on said first region of said second semiconductor layer;
   a first electrode formed both on said third semiconductor layer and a portion of said second major surface of said first semiconductor layer adjacent to said second region of said second semiconductor layer;
   a second electrode formed both on said fourth semiconductor layer and said second region of said second semiconductor layer; and
   a third electrode formed both on said first region of said second semiconductor layer and said separating layer, said third electrode being formed directly on said separating layer.

2. A reverse conducting gate turn-off thyristor in accordance with claim 1, wherein
   said separating layer includes a first conductivity type separating semiconductor layer formed to the extent of said predetermined depth of said second semiconductor layer,
said reverse conducting gate turn-off thyristor further comprising an insulation film interposed between said separating semiconductor layer and said third electrode.

3. A reverse conducting gate turn-off thyristor in accordance with claim 1, wherein
a portion of said third electrode on said separating layer serves as a collecting electrode for collecting current flowing through said third electrode.

4. A reverse conducting gate turn-off thyristor in accordance with claim 1, wherein
said separating layer surrounds said first region of said second semiconductor layer to isolate said first region from said second region of said second semiconductor layer.

5. A reverse conducting gate turn-off thyristor in accordance with claim 1, wherein
said separating layer surrounds said second region of said second semiconductor layer to isolate said second region from said first region of said second semiconductor layer.

6. A reverse conducting gate turn-off thyristor in accordance with claim 1, wherein
said third semiconductor layer includes a plurality of second conductivity type layers selectively formed on said portion of said second major surface of said first semiconductor layer corresponding to said first region of said second semiconductor layer;
said first electrode includes an electrode formed all over said plurality of layers and said second major surface of said first semiconductor layer.

7. A reverse conducting gate turn-off thyristor in accordance with claim 2, wherein
said separating semiconductor layer includes an impurity diffusion layer.

8. A reverse conducting gate turn-off thyristor in accordance with claim 1, wherein
said first conductivity has a conductivity opposite in polarity to said second conductivity.

9. A reverse conducting gate turn-off thyristor in accordance with claim 1, wherein
said first conductivity is n-type and said second conductivity is p-type.

10. A reverse conducting gate turn-off thyristor in accordance with claim 1, wherein
said insulation material includes $SiO_2$.

11. A reverse conducting gate turn-off thyristor in accordance with claim 1 wherein
said first and second major surfaces of said first semiconductor layer are substantially opposite from one another.

* * * * *